United States Patent
Vashchenko et al.

(10) Patent No.: US 7,705,403 B1
(45) Date of Patent: Apr. 27, 2010

(54) PROGRAMMABLE ESD PROTECTION STRUCTURE

(75) Inventors: Vladislav Vashchenko, Palo Alto, CA (US); Yuri Mirgorodski, Sunnyvale, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 393 days.

(21) Appl. No.: 11/324,455

(22) Filed: Jan. 3, 2006

(51) Int. Cl.
*H01L 23/62* (2006.01)

(52) U.S. Cl. .................. 257/360; 257/355

(58) Field of Classification Search .......... 257/355, 257/360
See application file for complete search history.

(56) References Cited

U.S. PATENT DOCUMENTS

| | | | | |
|---|---|---|---|---|
| 5,200,919 A | * | 4/1993 | Kaya | 365/185.24 |
| 5,811,852 A | * | 9/1998 | Ling | 257/315 |
| 5,932,916 A | * | 8/1999 | Jung | 257/355 |

* cited by examiner

*Primary Examiner*—Douglas M Menz
(74) *Attorney, Agent, or Firm*—Jurgen K. Vollrath

(57) ABSTRACT

In a LVTSCR or snapback NMOS ESD structure, low voltage protection as well as higher voltage protection is provided by introducing a floating gate that capacitively couples with the control gate of the ESD structure and programming the floating gate to have different charges on it as desired.

7 Claims, 2 Drawing Sheets

PROGRAMMABLE ESD PROTECTION STRUCTURE

FIELD OF THE INVENTION

The invention relates to ESD protection structures. In particular it relates to an LVTSCR or snapback NMOS structure suitable for the protection of low voltage circuits.

BACKGROUND OF THE INVENTION

It is desirable during assembly of semiconductor devices to provide ESD protection by providing a low voltage snapback device that continues to serve a useful purpose after assembly. Snapback devices such as SCRs, LVTSCRs, snapback NMOS are commonly known in the art but typically define a high impedance, low leakage structure with high breakdown voltage that is not suitable for low voltage protection during passive mode while the semiconductor device is being assembled.

The present invention seeks to provide a method and structure that addresses this issue.

SUMMARY OF THE INVENTION

The present invention provides a programmable LVTSCR or snapback NMOS structure that provides low voltage snapback in one mode and can be programmed to provide a high breakdown voltage mode.

According to the invention, there is provided a programmable LVTSCR ESD protection structure comprising a control gate, and a floating gate positioned to capacitively couple with the control gate. The floating gate is typically electrically insulated from the LVTSCR but positioned to facilitate charging of the floating gate by Fowler-Nordheim tunneling. The control gate and floating gate may be formed one on top of the other but electrically insulated from each other, as part of a double poly process, or may be formed next to each other as part of a single poly process.

Further, according to the invention, there is provided a method of providing a variable breakdown voltage ESD protection structure, comprising providing an LVTSCR or snapback NMOS ESD protection device, which includes a control gate, and forming a floating gate positioned to capacitively couple with the control gate. Typically, the floating gate is electrically isolated from the LVTSCR or snapback NMOS ESD protection device but positioned to facilitate charging of the floating gate by Fowler-Nordheim tunneling. During low breakdown voltage mode the floating gate may be charged to a potential of approximately 2-5 V. The control gate and floating gate may be formed one on top of the other as part of a double poly process or next to each other as part of a single poly process.

Still further, according to the invention, there is provided an adjustable breakdown snapback NMOS ESD protection structure comprising a control gate, an n+ drain region and an n+ source region formed on either side of a p-channel underneath the control gate, wherein the n+ drain region includes an unsilicided portion between a drain contact and the control gate to define a ballast region, the structure further comprising a floating gate positioned to capacitively couple with the control gate. The floating gate is typically electrically insulated from the snapback NMOS ESD protection device but positioned to facilitate charging of the floating gate by Fowler-Nordheim tunneling. During low breakdown voltage mode the floating gate may be charged to a potential of approximately 2-5 V, and the control gate and floating gate may be formed one on top of the other as part of a double poly process or next to each other as part of a single poly process.

DETAILED DESCRIPTION OF THE INVENTION

Figure 1:
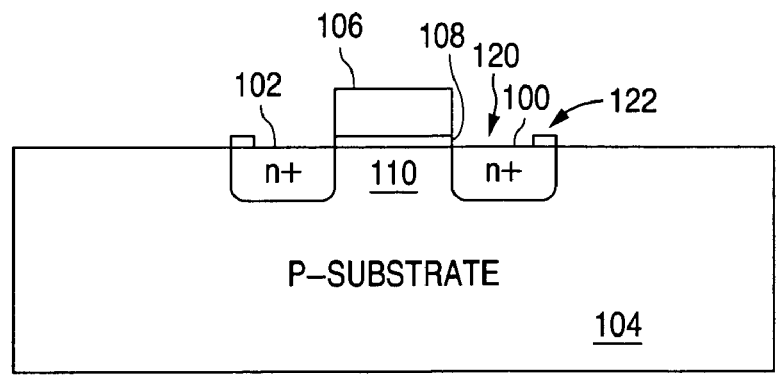
FIG. 1 shows a cross section through a prior art snapback NMOS.

FIG. 1 shows a typical snapback NMOS device as known in the art, comprising a first n+ region 100 defining a drain and a second n+ region 102 defining a source, both formed in a p-substrate or p-well 104. A polysilicon control gate 106 formed on an oxide layer 108 is formed over a channel 110 between the drain and source 100, 102. The snapback device is also characterized by the fact that it includes an unsilicided drain portion 120 between silicided drain contact region 122 and the gate 106. This is referred to as a drain ballast and acts as a distributed resistor.

Figure 2:
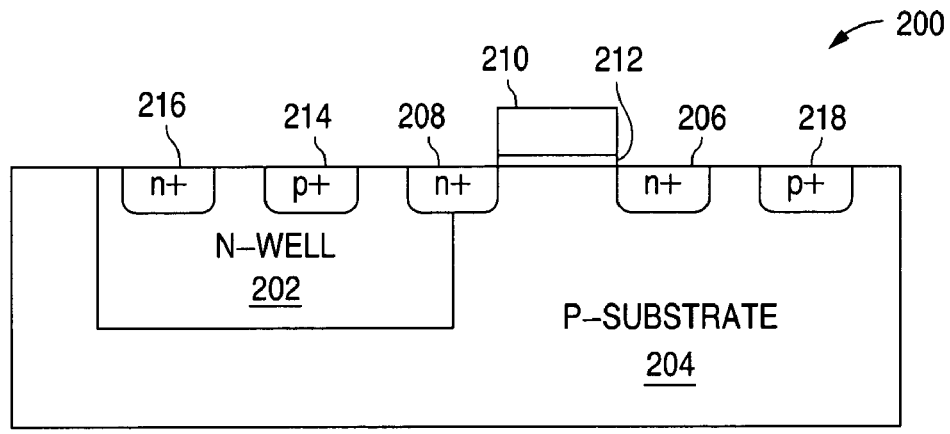
FIG. 2 shows a cross section through a prior art LVTSCR.

FIG. 2, in turn, shows a typical LVTSCR device 200 as known in the art. The LVTSCR 200 includes an n-well 202 formed in a p-well or p-substrate 204. The LVTSCR 200 defines an NMOS structure comprising a first n+ region 206 formed in the p-well or p-substrate 204, a second n+ region 208 formed partly in the n-well 202 and partly in the p-well or p-substrate 204, and a control gate 210 formed on an oxide layer 212. The LVTSCR further includes a first p+ region 214 formed in the n-well 202, a third n+ region 216 formed in the n-well 202, and a second p+ region 218 formed in the p-well or p-substrate 204.

The present invention proposes modifying the voltage of the control gate of a snapback NMOS or LVTSCR ESD protection structure by introducing a capacitive storage element into the ESD device, which can be charged up in a similar way as is known in EEPROM devices.

Figure 3:
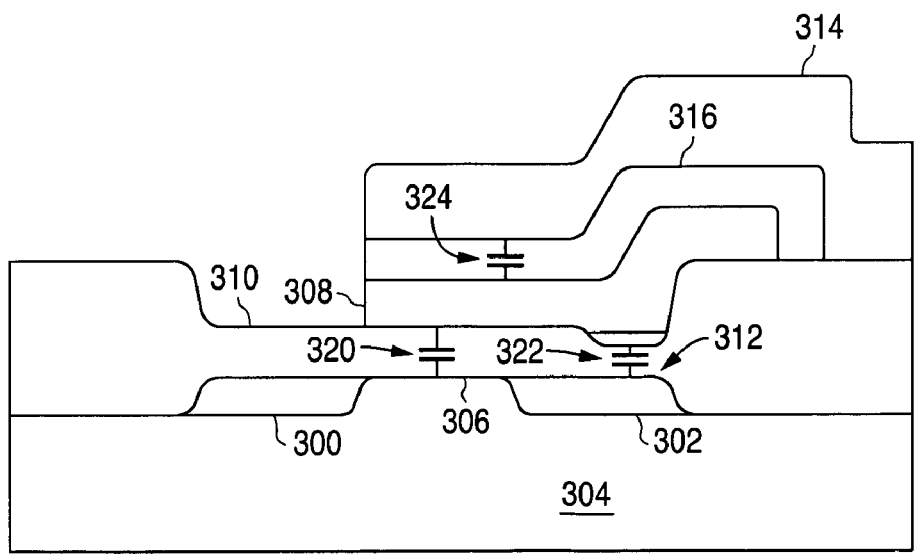
FIG. 3 shows a cross section through a prior art EEPROM.

For ease of understanding, a typical prior art EEPROM is shown in FIG. 3, which shows an n+ source 300 and n+ drain 302 formed in a p-substrate 304 and defining a p-channel 306 between them. A polycrystalline silicon floating gate 308 is separated from the channel 306 and drain 302 by a gate insulation 310 thereby defining a transistor 311. The gate insulation 310 defines a thin tunnel oxide region 312. A control gate 314 is separated from the floating gate 308 by an insulating layer 316 to provide a capacitance 324 between the control gate 314 and floating gate 308. The gate insulation 310, in turn, defines a channel capacitance 320 over the channel 306, and a tunnel oxide capacitance 322 over the drain 302. The structure of FIG. 3 is typically used in conjunction with a word coupling transistor (not shown) as known in the art, to provide word line and bit line connections. In order to store a logical 0 in the EEPROM, electrons are injected into the floating gate by 308 by Fowler-Nordheim tunneling by placing a high voltage (15-20 V) on the control gate 314, grounding the drain 302 by applying a similarly high voltage to the word line attached to the control gate of the word coupling transistor, and grounding the bit line connected to the drain of the word coupling transistor, and grounding source 300 and substrate 304. This causes electrons to be injected into the floating gate 308, thereby increasing the control gate threshold voltage needed to turn on the transistor 311.

The present invention introduces a floating gate under the control gate of the snapback NMOS or LVTSCR ESD protection structure, and makes use of Fowler-Nordheim tunneling to charge up the floating gate in a manner similar as is done for EEPROMs. In so doing, it is possible to control the voltage of the floating gate, and thus of the capacitively coupled control gate of the LVTSCR or snapback NMOS ESD protection structure, thereby in effect, programming the ESD protection structure to have different breakdown voltages as discussed further below.

Figure 4:
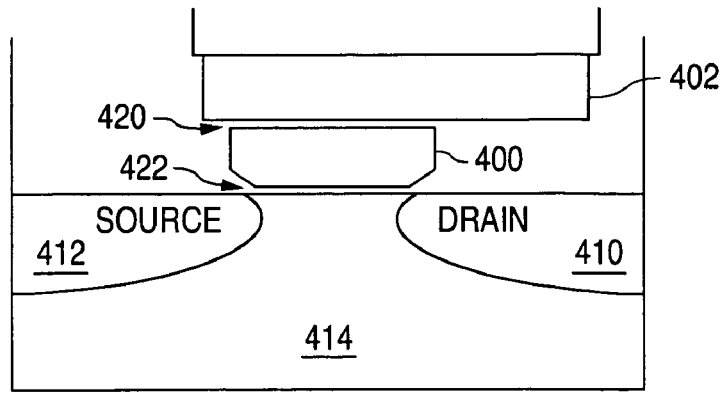
FIG. 4 shows a cross section through one embodiment of an ESD protection structure of the invention.

In the embodiment of FIG. 4, a floating gate 400 is formed underneath the control gate 402 of an NMOS structure, which may be an NMOS snapback structure or part of an LVTSCR. As shown in FIG. 4, the NMOS transistor includes a drain 410 and a source 412 formed in a substrate 414. The floating gate 400 is separated from the control gate 402 by an oxide gate insulation layer 420 to capacitively couple the floating gate 400 and control gate 402. The floating gate is also spaced from the channel region between drain and source by a gate insulator 422. By placing the appropriate voltage on the control gate 402, drain and source, it is possible to charge up the floating gate 400 to different voltages by means of Fowler-Nordheim tunneling. This will cause a voltage change on the control gate 402 due to the capacitive coupling between the floating gate 400 and control gate 402.

Figure 5:
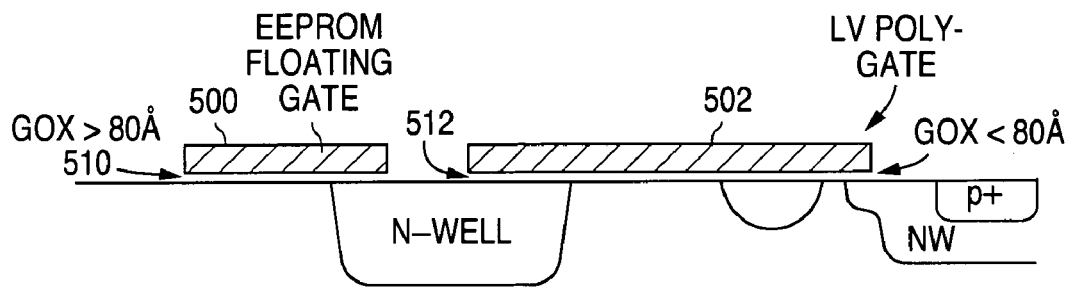
FIG. 5 shows a cross section through one embodiment of an ESD protection structure of the invention.
Figure 6:
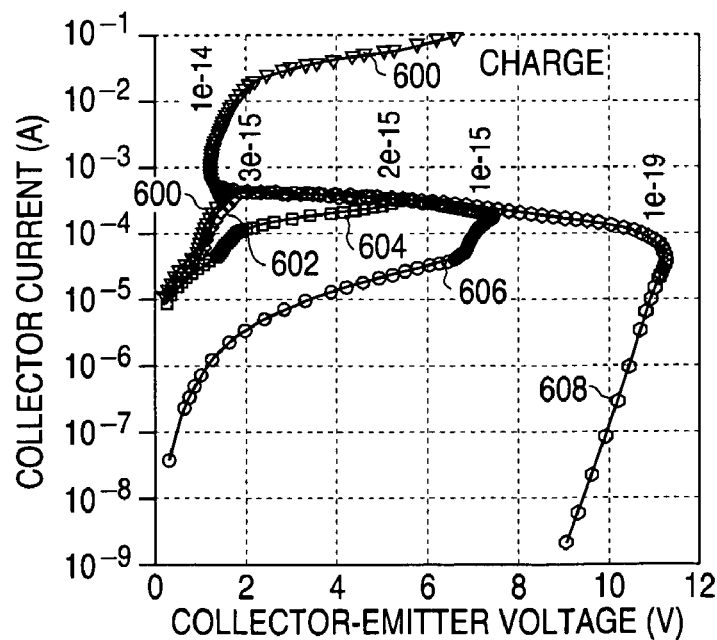
FIG. 6 shows collector current versus collector-emitter voltage curves for different charges on the control gate of an LVTSCR according to one embodiment of the invention.

In addition to the double polysilicon process of FIG. 4, the present invention is applicable to a single poly process as well as shown in the embodiment shown in FIG. 5. In this embodiment, the floating gate 500 of the EEPROM is positioned next to the low voltage poly gate, which acts as the control gate 502 of the LVTSCR. As shown in FIG. 5, the gate oxide 510 of the floating gate 500 is more than 80 Angstroms thick in this embodiment to avoid leakage once charged up by Fowler-Nordheim tunneling, while the gate oxide 512 under the control gate 502, which is a poly gate, is less than 80 Angstroms thick in this embodiment. As in the FIG. 4 embodiment, charging of the floating gate 500 becomes evident at the control gate 502 by capacitive coupling. The effect of charging up the control gate of an LVTSCR or snapback NMOS is best seen in the graphs FIG. 6 which shows the effect of a 1e-14 Coulomb charge on the control gate (curve 600), a 5e-15 Coulomb charge on the control gate (curve 602), a 2e-15 Coulomb charge on the control gate of a LVTSCR (curve 604), a 1e-15 Coulomb charge on the control gate (curve 606), and a 1e-159 Coulomb charge on the control gate (curve 608). As seen by the curves, the breakdown voltage of the LVTSCR goes down as the charge on its control gate increases. Thus by initially charging the control gate of the LVTSCR or snapback NMOS, the ESD device is suitable for low voltage protection as is found during the passive phase of a semiconductor circuit development, namely prior to its assembly. After assembly the EEPROM floating gate is programmed to a low state, which is reflected in the control gate of the ESD protection device. This transitions the ESD device into a high impedance state with low leakage and high breakdown voltage. Since many advanced processes allow EEPROM devices to be made without any additional process steps, the present invention is particularly useful in providing both a low and a high breakdown voltage.

While the present invention has been described with respect to a few specific embodiments, it will be appreciated that the invention is not so limited and can be implemented in any manner within the scope of the claims.

What is claimed is:

1. A programmable LVTSCR ESD protection structure comprising
    a control gate, and
    a floating gate separated by a gate insulator from a channel region between a source and a drain of the LVTSCR ESD protection structure, the floating gate being positioned relative to the control gate to capacitively couple with the control gate, wherein the floating gate and gate insulator are implemented to facilitate charging of the floating gate by Fowler-Nordheim tunneling.

2. A structure of claim 1, wherein the control gate and floating gate are formed one on top of the other but electrically isolated from each other, as part of a double poly process.

3. A structure of claim 1, wherein the control gate and floating gate are formed next to each other as part of a single poly process.

4. An adjustable breakdown snapback NMOS ESD protection structure comprising
    a control gate,
    a floating gate capacitively coupled to the control gate, and
    an n+ drain region and an n+ source region formed on either side of a p-channel underneath the floating gate, the n+ drain region including an unsilicided portion between a drain contact and the control gate to define a ballast region,
    wherein the floating gate is electrically isolated from the p-channel by a gate insulator arranged to facilitate charging of the floating gate by Fowler-Nordheim tunneling.

5. A structure of claim 4, wherein, during low breakdown voltage mode the floating gate is charged to a potential of approximately 2-5 V.

6. A structure of claim 4, wherein the control gate and floating gate are formed one on top of the other as part of a double poly process.

7. A structure of claim 4, wherein the control gate and floating gate are formed next to each other as part of a single poly process.

* * * * *